(12) United States Patent
Huang et al.

(10) Patent No.: US 11,462,602 B2
(45) Date of Patent: Oct. 4, 2022

(54) ARRAY SUBSTRATE, MANUFACTURING METHOD THEREOF, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yongchao Huang, Beijing (CN); Jun Cheng, Beijing (CN); Dongfang Wang, Beijing (CN); Jun Liu, Beijing (CN); Leilei Cheng, Beijing (CN); Liangchen Yan, Beijing (CN)

(73) Assignees: HEFEI XINSHENG OPTOELECTRONICS TECHNOLOGY CO., LTD., Hefei (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 201 days.

(21) Appl. No.: 16/905,899

(22) Filed: Jun. 18, 2020

(65) Prior Publication Data

US 2020/0411619 A1 Dec. 31, 2020

(30) Foreign Application Priority Data

Jun. 28, 2019 (CN) .......................... 201910582865.6

(51) Int. Cl.
*H01L 27/32* (2006.01)
*H01L 51/56* (2006.01)

(52) U.S. Cl.
CPC ...... *H01L 27/3258* (2013.01); *H01L 27/3272* (2013.01); *H01L 27/3276* (2013.01); *H01L 51/56* (2013.01); *H01L 2227/323* (2013.01)

(58) Field of Classification Search
None
See application file for complete search history.

(56) References Cited

U.S. PATENT DOCUMENTS 9,356,088 B2 5/2016 Chen
10,103,216 B2 10/2018 Jeong et al.
(Continued)

FOREIGN PATENT DOCUMENTS

CN 103745985 A 4/2014
CN 107799565 A 3/2018
(Continued)

OTHER PUBLICATIONS

First Chinese Office Action dated Feb. 1, 2021, received for corresponding Chinese Application No. 201910582865.6, 14 pages.

*Primary Examiner* — J. E. Schoenholtz
(74) *Attorney, Agent, or Firm* — Kinney & Lange, P.A.

(57) ABSTRACT

An array substrate, a manufacturing method thereof, and a display device are provided. The array substrate includes: a base substrate; a first signal line on the base substrate; a first buffer layer provided on the base substrate and covering the first signal line; a second signal line on a side of the first buffer layer facing away from the base substrate; a first insulating layer provided on the base substrate and covering the second signal line; and a thin film transistor on a side of the first insulating layer facing away from the base substrate, the thin film transistor including a gate electrode, a source electrode and a drain electrode. A thickness of the first signal line is greater than that of the gate electrode, and a thickness of the second signal line is greater than that of the source electrode or the drain electrode.

20 Claims, 15 Drawing Sheets

(56) References Cited

U.S. PATENT DOCUMENTS

| | | | |
|---|---|---|---|
| 2014/0151652 A1 | 6/2014 | Im et al. | |
| 2015/0144952 A1* | 5/2015 | Kim | H01L 27/124 438/158 |
| 2016/0071919 A1 | 3/2016 | Chen | |
| 2017/0077208 A1* | 3/2017 | Park | H01L 27/3276 |
| 2018/0061927 A1 | 3/2018 | Jeong et al. | |
| 2019/0181377 A1* | 6/2019 | Kim | H01L 27/3276 |
| 2019/0386034 A1* | 12/2019 | Lee | H01L 27/3246 |

FOREIGN PATENT DOCUMENTS

| | | |
|---|---|---|
| CN | 109037273 A | 12/2018 |
| EP | 3637469 A1 | 4/2020 |

* cited by examiner

ARRAY SUBSTRATE, MANUFACTURING METHOD THEREOF, AND DISPLAY DEVICE

CROSS-REFERENCE TO RELATED APPLICATION

This application claims the benefit of Chinese Patent Application No. 201910582865.6 filed on Jun. 28, 2019 in the National Intellectual Property Administration of China, the whole disclosure of which is incorporated herein by reference.

TECHNICAL FIELD

The present disclosure relates to the field of display technology, and in particular, to an array substrate and a manufacturing method thereof, and a display device including the array substrate.

BACKGROUND

With the continuous development of technology, high-resolution display devices have gradually become a research hotspot. For example, 8K resolution display devices are gradually appearing on the market. The 8K resolution display screen includes 7680×4320 pixels to form a high PPI (Pixels Per Inch) display screen. A high-PPI display screen may display images with a high pixel density, thereby achieving a high-quality display.

For example, in the high-PPI display device with the 8K resolution, it is an important researched issue in this field on reducing or avoiding various adverse effects caused by a voltage drop due to a resistance on a wiring.

SUMMARY

In order to solve at least one aspect of the above problems, the present disclosure provides an array substrate and a manufacturing method thereof, and a display device including the array substrate.

In an aspect, some embodiments provide an array substrate, comprising: a base substrate; a first signal line on the base substrate; a first buffer layer provided on the base substrate and covering the first signal line; a second signal line on a side of the first buffer layer facing away from the base substrate; a first insulating layer provided on the base substrate and covering the second signal line; and a thin film transistor on a side of the first insulating layer facing away from the base substrate, the thin film transistor comprising a gate electrode, a source electrode and a drain electrode, wherein a thickness of the first signal line is greater than a thickness of the gate electrode of the thin film transistor, and a thickness of the second signal line is greater than a thickness of the source electrode or the drain electrode of the thin film transistor.

In some embodiments, the thickness of the first signal line is at least 1.5 times of the thickness of the gate electrode of the thin film transistor, and the thickness of the second signal line is at least 1.5 times of the thickness of the source electrode or the drain electrode of the thin film transistor.

In some embodiments, the first signal line and the second signal line each comprise a copper-based metal.

In some embodiments, the first signal line comprises a gate line, and the second signal line comprises a power supply line or a data line.

In some embodiments, the first insulating layer comprises a first interlayer dielectric layer and a second buffer layer, the first interlayer dielectric layer is disposed on both sides of the second signal line, and the second buffer layer is disposed on a side of the first interlayer dielectric layer facing away from the base substrate and covers the second signal line; and an orthographic projection of the thin film transistor on the base substrate does not overlap with an orthographic projection of the first interlayer dielectric layer on the base substrate.

In some embodiments, the array substrate further comprising a light shielding layer between the first buffer layer and the second buffer layer, wherein the orthographic projection of the thin film transistor on the base substrate at least partially overlaps with an orthographic projection of the light shielding layer on the base substrate, and the orthographic projection of the light shielding layer on the base substrate does not overlap with the orthographic projection of the first interlayer dielectric layer on the base substrate.

In some embodiments, the first buffer layer comprises a recessed area, the recessed area is recessed toward the base substrate, and an orthographic projection of each of the thin film transistor and the light shielding layer on the first buffer layer falls within the recessed area.

In some embodiments, the array substrate further comprises: a second interlayer dielectric layer, the second interlayer dielectric layer being disposed on a side of the second buffer layer facing away from the base substrate; a first conductive plug which is disposed in a via hole penetrating the first buffer layer, located on a side of the first signal line away from the base substrate, and electrically connected to the first signal line; and a second conductive plug in a via hole penetrating both the second buffer layer and the second interlayer dielectric layer, the second conductive plug electrically being connected to the first signal line through the first conductive plug.

In some embodiments, the thin film transistor comprises a switching transistor, and the first signal line is electrically connected to a gate electrode of the switching transistor through both the first conductive plug and the second conductive plug.

In some embodiments, the array substrate further comprises: a third conductive plug in another via hole penetrating through both the second buffer layer and the second interlayer dielectric layer, one of the source electrode and the drain electrode being electrically connected to the second signal line through the third conductive plug.

In some embodiments, the thin film transistor further comprises a driving transistor; and the second signal line comprises a data line and a power supply line, the data line is electrically connected to one of a source electrode and a drain electrode of the switching transistor, and the power supply line is electrically connected to one of a source electrode and a drain electrode of the driving transistor.

In some embodiments, the other one of the source electrode and the drain electrode of the switching transistor is electrically connected to a gate electrode of the driving transistor.

In some embodiments, the array substrate further comprises: a fourth conductive plug in another via hole penetrating both the second buffer layer and the second interlayer dielectric layer, the light shielding layer being electrically connected to the second signal line through the fourth conductive plug.

In some embodiments, the first conductive plug is located in the same layer as the light shielding layer, and each of the second conductive plug, the third conductive plug, and the fourth conductive plug is located in the same layer as the source electrode or the drain electrode.

In some embodiments, the array substrate further comprising: a second insulating layer on a side of the second interlayer dielectric layer facing away from the base substrate; a color film layer on a side of the second insulating layer facing away from the base substrate; a third insulating layer provided on the side of the second insulating layer facing away from the base substrate and covering the color film layer; and a first electrode on a side of the third insulating layer facing away from the base substrate, the first electrode being electrically connected to the other one of the source electrode and the drain electrode through a conductive plug in both the second insulating layer and the third insulating layer.

In some embodiments, the thin film transistor is a top-gate thin film transistor.

In another aspect, some embodiments provide a display device comprising the array substrate of the above embodiments.

In yet another aspect, some embodiments provide a method of manufacturing an array substrate, comprising: forming a first signal line on a base substrate; forming a first buffer layer covering the first signal line on the base substrate; forming a second signal line on a side of the first buffer layer facing away from the base substrate; forming a first insulating layer covering the second signal line on the base substrate; and forming a thin film transistor on a side of the first insulating layer facing away from the base substrate, the thin film transistor comprising a gate electrode, a source electrode and a drain electrode, wherein a thickness of the first signal line is greater than a thickness of the gate electrode of the thin film transistor, and a thickness of the second signal line is greater than a thickness of the source electrode or the drain electrode of the thin film transistor.

In some embodiments, the method further comprising: forming an opening in the first interlayer dielectric layer; and through one patterning process, forming a light shielding layer on a side of the first buffer layer facing away from the base substrate and in the opening, and forming a first conductive part on a side of the first signal line facing away from the base substrate.

In some embodiments, the method further comprising: forming a second interlayer dielectric layer covering the thin film transistor on a side of the second buffer layer facing away from the base substrate; through one patterning process, forming a first via hole and a second via hole, both of which penetrate the second interlayer dielectric layer, and forming a third via hole, a fourth via hole and a fifth via hole, each of which penetrates both the second buffer layer and the second interlayer dielectric layer; and depositing a conductive metal material to form a second conductive part in the third via hole, a third conductive part in the fourth via hole, and a fourth conductive part in the fifth via hole, so that the second conductive part is electrically connected to the first signal line through the first conductive part, one of the source electrode and the drain electrode is electrically connected to the second signal line through the third conductive part, and the light shielding layer is electrically connected to the second signal line through the fourth conductive part.

BRIEF DESCRIPTION OF THE DRAWINGS

By means of the following description of the present disclosure with reference to accompanying drawings, other objects and advantages of the present disclosure will be apparent and it may help a comprehensive understanding of the present disclosure.

Figure 1:
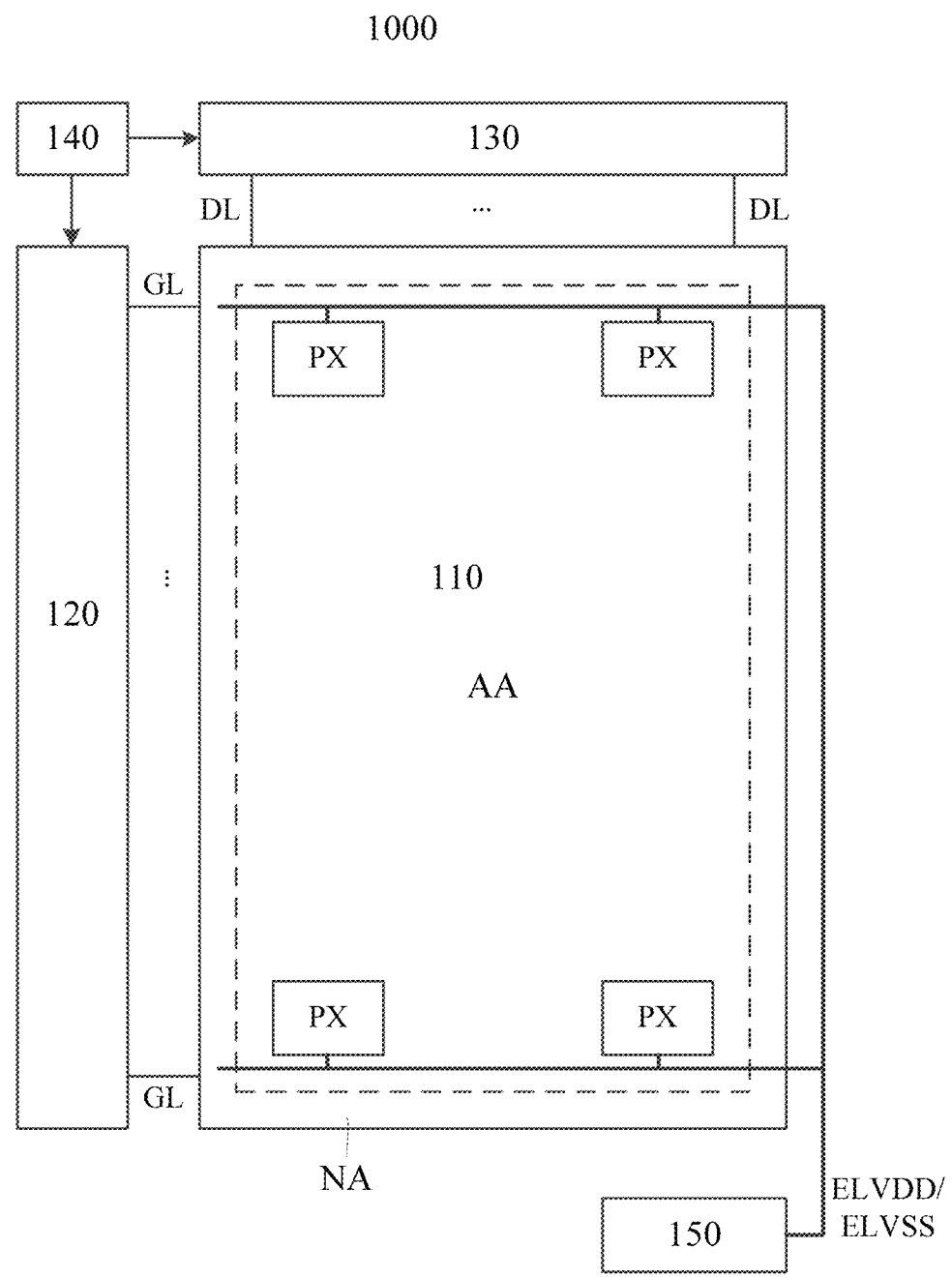
FIG. 1 is a schematic structural view of a display device according to some embodiments of the present disclosure.

It should be noted that, for the sake of clarity, in the drawings for describing the embodiments of the present disclosure, sizes of layers, structures, or regions may be enlarged or reduced, that is, these drawings are not drawn to actual scale.

DETAILED DESCRIPTION OF EMBODIMENTS

The technical solutions of the present disclosure will be further specifically described below through the embodiments and the accompanying drawings. In the description, the same or similar reference numerals indicate the same or similar components. The following description of the embodiments of the present disclosure with reference to the drawings is intended to explain the general inventive concept of the present disclosure, and should not be construed as limiting the present disclosure.

Moreover, in the following detailed description, for ease of explanation, many specific details are set forth to provide a comprehensive understanding of the embodiments of the present disclosure. Obviously, however, one or more embodiments may be implemented without these specific details.

It should be noted that terms "on", "formed on" and "provided on" described in this article may mean that one layer is directly formed or provided on another layer, or may mean that one layer is indirectly formed or provided on another layer, that is, there are other layers between the two layers.

It should be noted that although terms "first", "second" or the like may be used herein to describe various components, members, elements, regions, layers and/or parts, these components, members, elements, regions, layers and/or parts should not be limited by these terms. Rather, these terms are used to distinguish one component, member, element, region, layer, and/or part from another component, member, element, region, layer, and/or part. Thus, for example, a first component, a first member, a first element, a first region, a first layer, and/or a first part discussed below may be referred to as a second component, a second member, a second element, a second region, a second layer and/or a second part without departing from the teachings of the present disclosure.

In this context, unless otherwise stated, an expression "located in the same layer" means that two layers, components, members, elements or parts may be formed by the same one patterning process, and these two layers, components, members, elements or parts are generally formed of the same material. Accordingly, an expression "in different layers" means that two layers, components, members, elements or parts are formed on the base substrate in different process steps, for example, formed on the base substrate in different deposition steps and formed through different patterning processes; usually, the number of layers provided between the base substrate and one of the two layers, components, members, elements or parts is different from the number of layers provided between the base substrate and the other one of the two layers, components, members, elements or parts, that is, the two layers, components, members, elements or parts are spaced apart from the base substrate by different layers.

In this context, unless otherwise specified, a term "signal line" refers to conductive lines for transmitting various signals such as scanning signals, voltage signals, current signals, and it may include but is not limited to gate lines, data lines, power supply lines.

In this context, unless otherwise specified, an expression "thickness" generally refers to a size of a layer, component, member, element or part in a direction perpendicular to a surface (an upper surface as shown in the cross-sectional views), on which the thin film transistor is provided, of the base substrate.

In this context, unless otherwise stated, an expression "conductive plug" is used to refer to a conductive material part formed in a via hole in a material layer such as a buffer layer, an interlayer dielectric layer, an insulating layer. Generally, the via hole is formed in the material layer such as the buffer layer, the interlayer dielectric layer, the insulating layer or the like, and then a conductive material is deposited in the via hole, so that the conductive material fills at least a part of the via hole to form the conductive plug in the material layer.

Those skilled in the art should understand that, at normal temperature, for example, although the line of a metal wire is composed of a conductor, its resistance is non-zero. After the current flows through the line, a certain voltage drop due to the resistance will occur. Such a phenomenon is called IR Drop.

Referring to FIG. 1, the display device 1000 may include a display panel 110, a gate driver 120, a data driver 130, a controller 140, and a voltage generator 150. For example, the display device 1000 may be an OLED display device. The display panel 110 may include an array substrate 100 and a plurality of pixels PX. The array substrate 100 may include a display area AA and a non-display area NA. The plurality of pixels PX are arranged in an array in the display area AA. A first voltage such as ELVDD and a second voltage such as ELVSS may be applied to the pixel PX. The first voltage such as ELVDD may be higher than the second voltage such as ELVSS. Alternatively, the first voltage such as ELVDD may be applied to an anode of an organic light emitting device (e.g., OLED), and the second voltage such as ELVSS may be applied to a cathode of the organic light emitting device, so that the organic light emitting device may emit light.

For example, each pixel PX may include a plurality of sub-pixels, for example, a red sub-pixel, a green sub-pixel, and a blue sub-pixel, or may include a white sub-pixel, a red sub-pixel, a green sub-pixel, and a blue sub-pixel.

Figure 2:
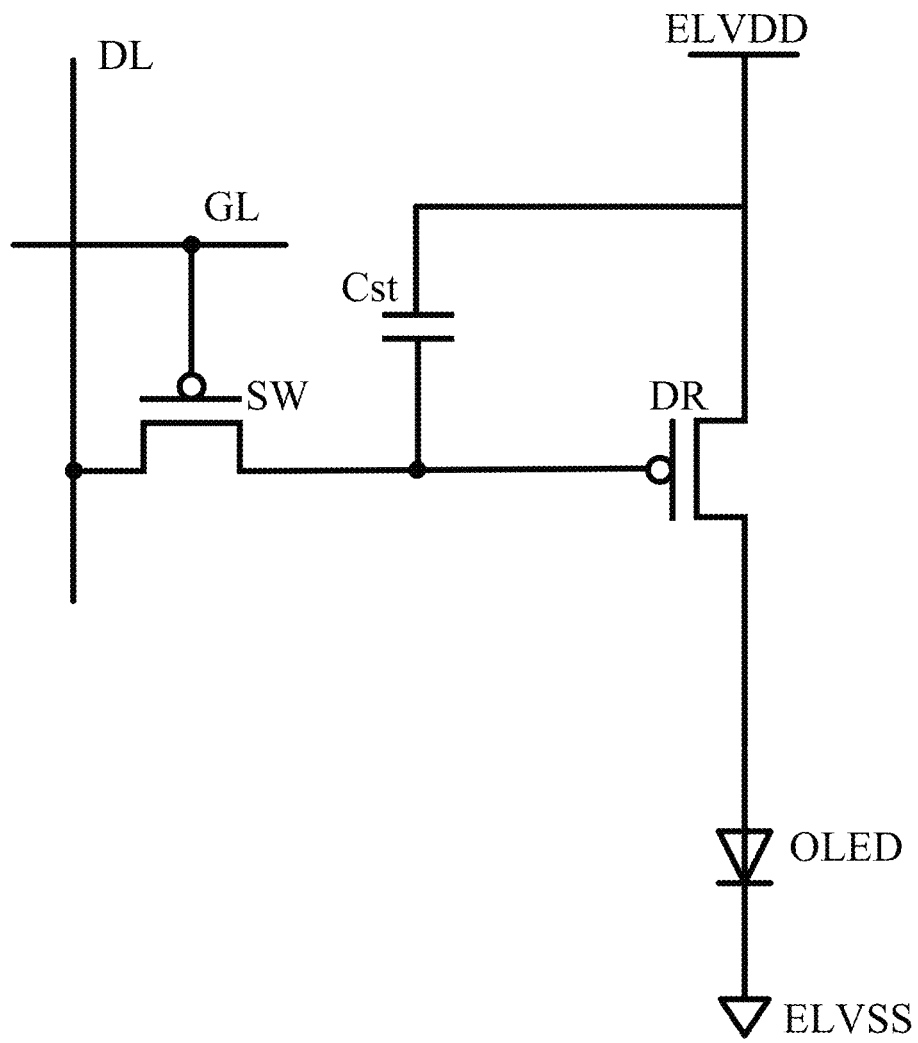
FIG. 2 is a schematic view of a pixel driving circuit of an array substrate according to some embodiments of the present disclosure.

As shown in FIG. 2, each sub-pixel may include a pixel driving circuit, for example, the pixel driving circuit may include a switching transistor SW, a driving transistor DR, a capacitor Cst, and an organic light emitting diode OLED. A first electrode (e.g., source electrode) of the switching transistor SW is electrically connected to a data line DL, and a second electrode (e.g., drain electrode) of the switching transistor SW is electrically connected to a gate electrode of the driving transistor DR. The first electrode (e.g., source electrode) of the driving transistor DR is electrically connected to a first power supply line ELVDD, and a second electrode (e.g., drain electrode) of the driving transistor DR is electrically connected to an anode of the OLED. A first electrode of the capacitor Cst is electrically connected to a gate electrode of the driving transistor DR, and a second electrode of the capacitor Cst is electrically connected to the first electrode (e.g., source electrode) of the driving transistor DR. The anode of the OLED is electrically connected to the second electrode of the driving transistor DR, and the cathode of the OLED is electrically connected to a second power supply line ELVSS.

For example, the pixel driving circuit may be operated as follows. First, when a scanning signal having a low level is sent to the gate line GL, the switching transistor SW is turned on. In this state, a data voltage applied to the data line DL is applied to the gate electrode of the drive transistor DR through the switching transistor SW, and at the same time, the capacitor Cst is charged, and the data voltage is stored in the capacitor Cst. Then, the driving transistor DR operates with a predetermined voltage stored in the capacitor Cst as a quiescent current source, and supplies a current to the OLED to drive the OLED to emit light.

As an example, FIG. 2 shows a sub-pixel having a 2T (transistor) 1C (capacitor) configuration. The embodiments of the present disclosure are not limited thereto, and each sub-pixel may have other configurations, for example, a compensation circuit may be added to the pixel driving circuit of the sub-pixel, so that the sub-pixel may have a configuration such as 3T1C, 3T2C, 4T2C, 5T1C, 6T2C, 7T1C and the like.

Figure 3:
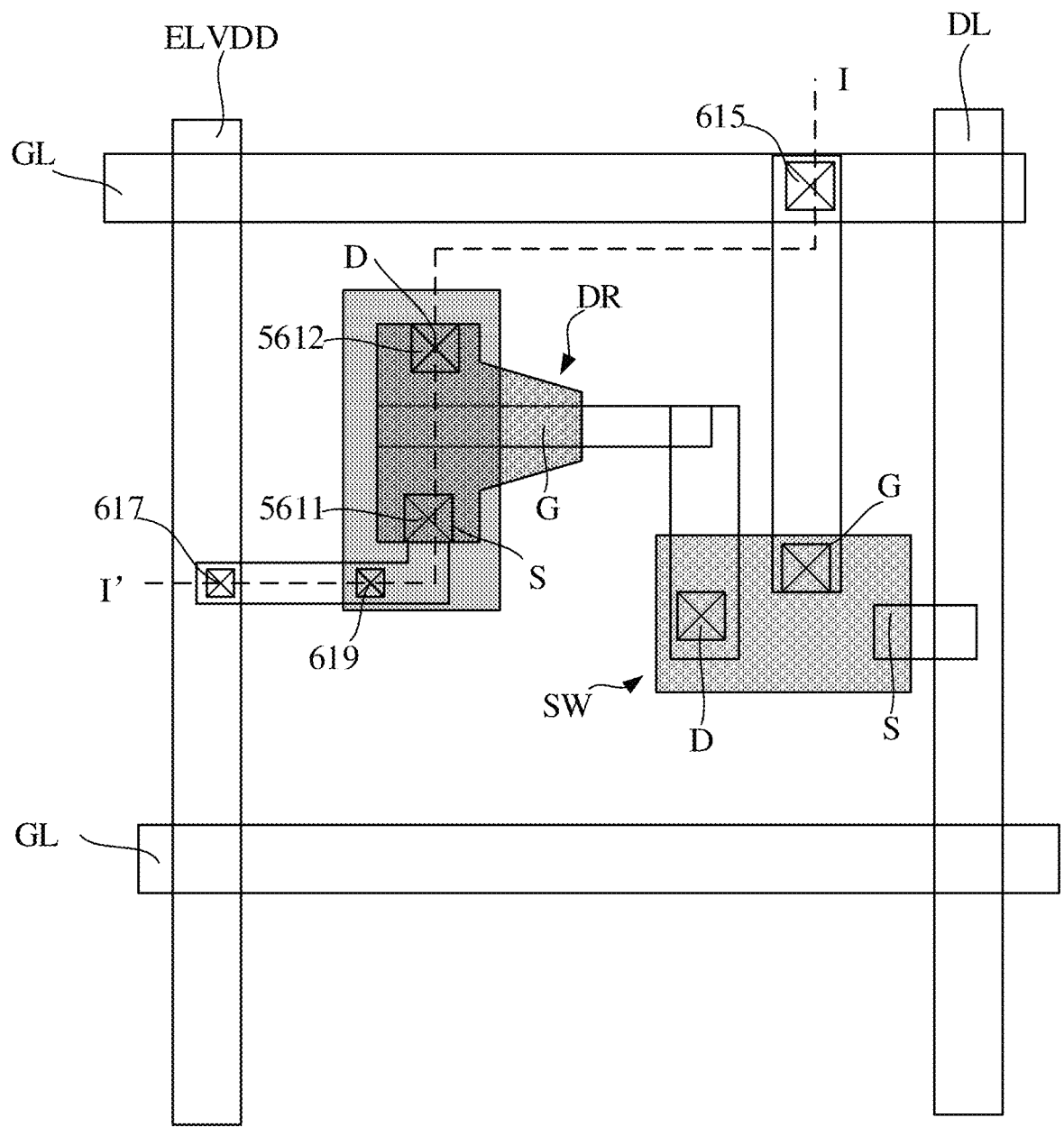
FIG. 3 is a schematic plan view of one sub-pixel of an array substrate according to some exemplary embodiments of the present disclosure.
Figure 4:
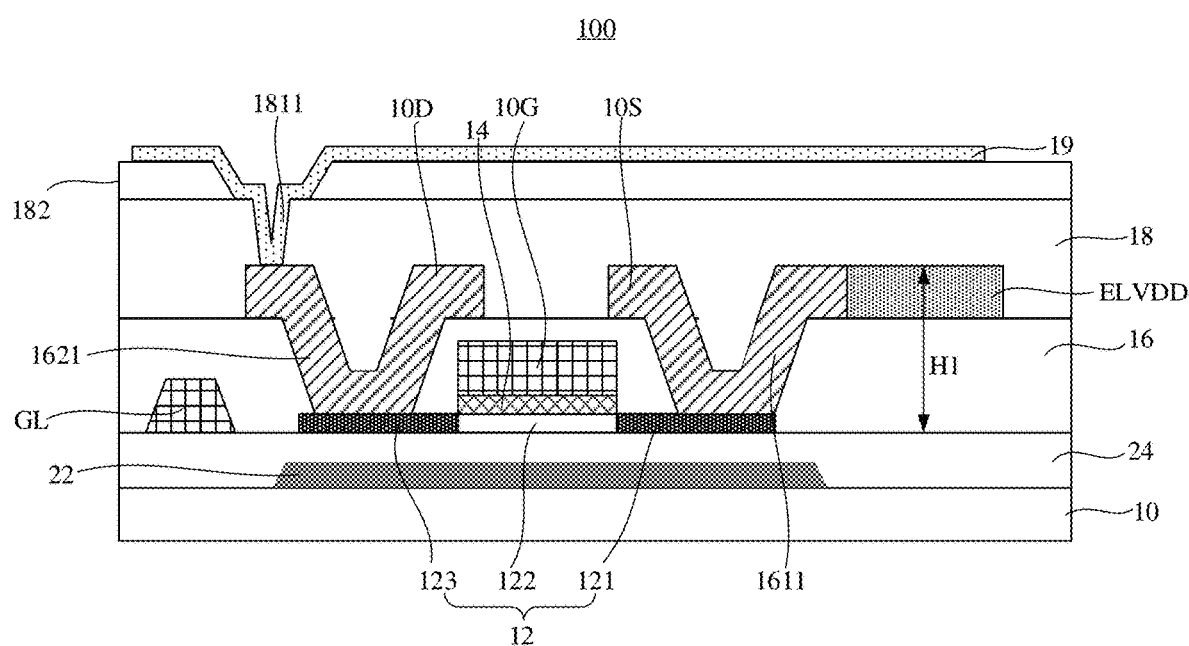
FIG. 4 is a cross-sectional view, taken along line I-I' in FIG. 3, of one sub-pixel of an array substrate according to some exemplary embodiments of the present disclosure.

FIG. 3 is a schematic plan view of one sub-pixel of an array substrate according to some exemplary embodiments of the present disclosure, and FIG. 4 is a cross-sectional view, taken along line I-I' in FIG. 3, of one sub-pixel of an array substrate according to some exemplary embodiments of the present disclosure. In order to clearly describe details of the array substrate according to some embodiments of the present disclosure, a structure of each layer such as OLED is omitted in the plan view, and only one transistor provided in the sub-pixel, for example, the driving transistor DR, is shown in the cross-sectional view. It should be understood that, unless otherwise specified, the following description for the driving transistor DR is also applicable to other thin film transistors including the switching transistor SW.

Referring to FIGS. 2-4 in combination, the array substrate 100 may include a base substrate 10. A first signal line such as a gate line GL and a second signal line such as a data line DL or a power supply line ELVDD are intersectingly provided on the base substrate 10 so as to surround and form sub-pixels. For example, the driving transistor DR may include a gate electrode 10G, a source electrode 10S, a drain electrode 10D, an active layer 12 and a gate insulating layer 14. In the illustrated embodiments, the driving transistor DR may have a top gate structure, however, the embodiments of the present disclosure are not limited thereto, and each transistor mentioned in the embodiments of the present disclosure may also have a bottom gate structure. Hereinafter, taking the top-gate thin film transistor as an example, the embodiments of the present disclosure will be described in more detail.

Specifically, the active layer 12 is disposed on the base substrate 10, and the active layer 12 may include a channel region 122, a source region 121 and a drain region 123 located on both sides of the channel region 122. The active layer 12 may be formed of a semiconductor material, which may include, for example, amorphous silicon, polycrystalline silicon, an oxide semiconductor, etc. The oxide semiconductor material may include, for example, IGZO (indium gallium zinc oxide), ZnO (zinc oxide), or the like. The source region 121 and the drain region 123 may be conductive, for example, through plasma treatment and high-temperature treatment, to form good electrical connections with the source electrode 10S and the drain electrode 10D, respectively, so that the transmission of electrical signals may be better achieved.

The gate insulating layer 14 is provided on a side of the active layer 12 facing away from the base substrate 10. For example, the material of the gate insulating layer 14 may include silicon nitride ($SiN_x$), silicon oxide ($SiO_x$), aluminum oxide ($Al_2O_3$), aluminum nitride (AlN), or other suitable materials.

The gate electrode 10G may be disposed on a side of the gate insulating layer 14 facing away from the base substrate 10. Further, the array substrate 100 may further include a first insulating layer 16 disposed on a side of the gate electrode 10G away from the base substrate 10. The first insulating layer 16 covers the gate electrode 10G, the gate insulating layer 14 and the active layer 12, and a via hole is formed in the first insulating layer 16, and a conductive material is deposited in the via hole to form a fifth conductive plug 1611 and a sixth conductive plug 1621. The source electrode 10S and the drain electrode 10D are electrically connected to the source region 121 and the drain region 123 through a fifth conductive plug 1611 and a sixth conductive plug 1621, respectively.

As shown in FIG. 4, the array substrate 100 may further include a second insulating layer 18 disposed on a side of the first insulating layer 16 facing away from the base substrate 10, and a first electrode 19 disposed on a side of the second insulating layer 18 facing away from the base substrate 10, for example, the first electrode 19 may be an anode of the OLED. A via hole is formed in the second insulating layer 18, and a conductive material is deposited in the via hole to form a seventh conductive plug 1811. Optionally, a third insulating layer 182 may also be provided between the second insulating layer 18 and the first electrode 19, and a via hole is formed in both the second insulating layer 18 and the third insulating layer 182, and the conductive material is deposited in the via hole to form the seventh conductive plug 1811. The first electrode 19 is electrically connected to the source electrode 10S or the drain electrode 10D of the thin film transistor through the seventh conductive plug 1811.

As shown in FIGS. 3 and 4, the array substrate 100 may further include signal lines provided on the base substrate 10. For example, the signal lines may include at least one of the gate line GL, the data line DL, and the power supply line ELVDD. For example, the signal lines include the gate line GL (may be referred to as a first signal line) and the power supply line ELVDD (may be referred to as a second signal line), and the gate line GL may be in the same layer as the gate electrode 10G. The power supply line ELVDD may be in the same layer as the source electrode 10S and the drain electrode 10D. That is, the gate line GL and the gate electrode 10G are formed of the same material, and the gate line GL has the same thickness as the gate electrode 10G; the power supply line ELVDD is formed of the same material as the source electrode 10S and the drain electrode 10D, and the power supply line ELVDD has the same thickness as the source electrode 10S or the drain electrode 10D. For example, the material of each of the gate line GL, the gate electrode 10G, the power supply line ELVDD, the source electrode 10S, and the drain electrode 10D may include a copper-based metal, for example, copper (Cu), copper-molybdenum alloy (Cu/Mo), copper-titanium Alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb), etc.

Optionally, as shown in FIG. 4, the array substrate 100 may further include a light shielding layer 22 provided on the base substrate 10. The light shielding layer 22 is located between the base substrate 10 and the active layer 12, and an orthographic projection of the active layer 12 on the base substrate 10 falls within an orthographic projection of the light shielding layer 22 on the base substrate 10, so that it may avoid external light from influencing the active layer 12. Optionally, a buffer layer 24 is provided between the light shielding layer 22 and the active layer 12.

The inventor found through research that in the high PPI display device, the IR Drop of each signal line has a great influence on the signal transmitted thereon, so it is necessary to use low resistivity materials to form the signal line and increase the thickness of the signal line, that is, to employ the signal line with large thickness, so as to reduce a resistance of the signal line, thereby reducing the influence of the IR Drop. For example, a thick copper process may be used to form the signal line, that is, the signal line is formed of a copper material with a large thickness. For example, the thickness of the signal line formed by the thick copper process may be at least 1.5 times of the thickness of the signal line formed by a conventional process. Specifically, the thickness of the signal line formed by the thick copper process is more than 7000 Å, that is, in the embodiments of the present disclosure, the signal line 20 may be a copper wire with a thickness of more than 7000 Å.

Referring to FIG. 4, thicknesses of the gate line GL and the power supply line ELVDD are relatively large. The first insulating layer 16 covers the gate line GL, and the second insulating layer 18 covers the power supply line ELVDD. Therefore, the first insulating layer 16 and the second insulating layer 18 are relatively thick.

Further, with reference to FIGS. 2-4, the capacitor Cst shown in FIG. 2 is generally formed between two conductive layers, that is, one conductive layer serves as a first electrode plate of the capacitor Cst, and the other conductive layer serves as a second electrode plate of the capacitor Cst, an insulating layer is interposed between the two electrode plates to form the capacitor Cst. For example, the conductive light shielding layer 22 may be electrically connected to the power supply line ELVDD, so as to serve as the first electrode plate of the capacitor Cst, the gate electrode 10G of the driving transistor DR may serve as the second electrode plate of the capacitor Cst. An orthographic projection of the light shielding layer 22 on the base substrate 10 overlaps with an orthographic projection of the gate electrode 10G of the driving transistor DR on the base substrate 10, and a plurality of insulating layers are interposed between the light shielding layer 22 and the gate electrode 10G of the driving transistor DR to form the capacitor Cst.

Figure 5:
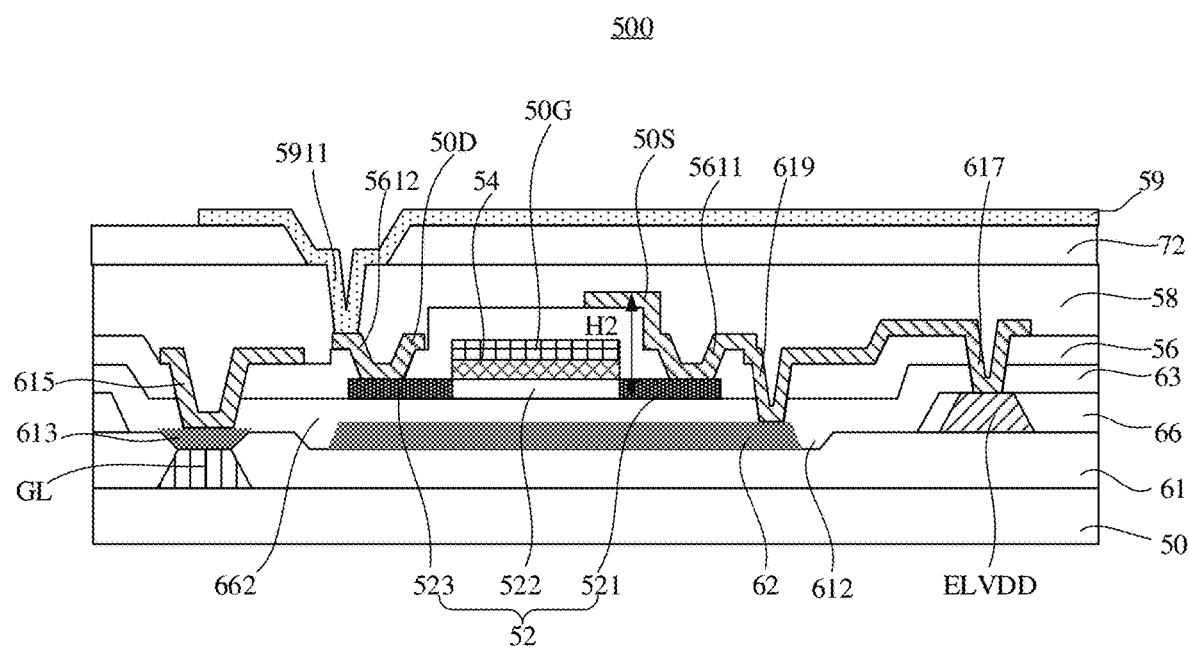
FIG. 5 is a cross-sectional view, taken along line I-I' in FIG. 3, of one sub-pixel of the array substrate according to some exemplary embodiments of the present disclosure.

FIG. 5 is a cross-sectional view, taken along line I-I' in FIG. 3, of one sub-pixel of the array substrate according to some exemplary embodiments of the present disclosure, in order to clearly describe the structure of the array substrate according to some embodiments of the present disclosure, only one transistor provided in the sub-pixel, for example, the driving transistor DR is shown.

Referring to FIGS. 2, 3 and 5 in combination, the array substrate 500 may include the base substrate 50. The gate line GL crosses both the data line DL and the power supply line ELVDD on the base substrate 50 to surround and form sub-pixels. For example, the driving transistor DR may include a gate electrode 50G, a source electrode 50S, a drain electrode 50D, an active layer 52, and a gate insulating layer 54. In the illustrated embodiment, the driving transistor DR may have a top gate structure, however, the embodiments of the present disclosure are not limited thereto, and each transistor mentioned in the embodiments of the present disclosure may also have a bottom gate structure. Hereinafter, taking the top-gate thin film transistor as an example, the embodiments of the present disclosure will be described in more detail.

Specifically, the active layer 52 is disposed on the base substrate 50. The active layer 52 may include a channel region 522, a source region 521 and a drain region 523 located on both sides of the channel region 522. The active layer 52 may be formed of a semiconductor material, which may include, for example, amorphous silicon, polycrystalline silicon, an oxide semiconductor, etc. The oxide semiconductor material may include, for example, IGZO (indium gallium zinc oxide), ZnO (zinc oxide), or the like. The source region 521 and the drain region 523 may be conductive, for example, by plasma treatment and high-temperature treatment, to form good electrical connections with the source electrode 50S and the drain electrode 50D, respectively, so that the transmission of electrical signals may be better achieved.

The gate insulating layer 54 is provided on a side of the active layer 52 facing away from the base substrate 50. For example, the material of the gate insulating layer 54 may include silicon nitride ($SiN_x$), silicon oxide ($SiO_x$), aluminum oxide ($Al_2O_3$), aluminum nitride (AlN), or other suitable materials.

As shown in FIG. 5, the array substrate 100 may further include signal lines provided on the base substrate 50. For example, the signal lines may include at least one of the gate line GL, the data line DL, and the power supply line ELVDD. Specifically, the signal lines include the gate line GL (may be referred to as a first signal line) and the power supply line ELVDD (may be referred to as a second signal line), and the gate line GL and the power supply line ELVDD are both provided on a side of the thin film transistor DR facing the base substrate 50, that is, any one of the gate line GL and the power supply line ELVDD is located on a different layer from the thin film transistor DR. For example, the array substrate 100 includes: the gate line GL disposed on the base substrate 50; the first buffer layer 61 disposed on the base substrate 50 and covering the gate line GL; the power supply line ELVDD disposed on a side of the first buffer layer 61 facing away from the base substrate 50; and a first insulating layer provided on the base substrate 50 and covering the power supply line ELVDD. The first insulating layer may include a first interlayer dielectric layer 66 and a second buffer layer 63. The thin film transistor is disposed on a side of the first insulating layer facing away from the base substrate.

As shown in FIG. 5, the gate electrode 50G may be disposed on a side of the gate insulating layer 54 facing away from the base substrate 50. Further, the array substrate 100 may further include a second interlayer dielectric layer 56 disposed on a side of the gate electrode 50G facing away from the base substrate 50. The second interlayer dielectric layer 56 covers the gate electrode 50G, the gate insulating layer 54 and the active layer 52, a via hole is formed in the second interlayer dielectric layer 56, and a conductive material is deposited in the via hole to form a fifth conductive plug 5611 and a sixth conductive plug 5612. The source electrode 50S and the drain electrode 50D are electrically connected to the source region 521 and the drain region 523 through the fifth conductive plug 5611 and the sixth conductive plug 5612, respectively.

As shown in FIG. 5, the array substrate 100 may further include a second insulating layer 58 disposed on a side of the second interlayer dielectric layer 56 facing away from the base substrate 50, and a first electrode 59 on a side of the second insulating layer 58 facing away from the base substrate 50, for example, the first electrode 59 may be an anode of the OLED. A via hole is formed in the second insulating layer 58, and a conductive material is deposited in the via hole to form a seventh conductive plug 5911. The first electrode 59 is electrically connected to the source electrode 50S or the drain electrode 50D of the thin film transistor through the seventh conductive plug 5911.

For example, the array substrate 100 may include a third insulating layer 72 disposed between the second insulating layer 58 and the first electrode 59. The first electrode 59 may be disposed on a side of the third insulating layer 72 facing away from the base substrate 50, and the first electrode 59 is electrically connected to the drain electrode 50D through the seventh conductive plug 5911 formed in both the second insulating layer 58 and the third insulating layer 72.

Optionally, as shown in FIG. 5, the array substrate 100 may further include a light shielding layer 62 provided on the base substrate 50. The light shielding layer 62 is disposed on a side of the first buffer layer 61 facing away from the base substrate 50. An orthographic projection of the active layer 52 on the base substrate 50 falls within an orthographic projection of the light shielding layer 62 on the base substrate 50. In this way, interference of external light on the active layer 52 may be avoided.

As shown in FIG. 5, an orthographic projection of the thin film transistor DR on the base substrate 50 does not overlap with an orthographic projection of the first interlayer dielectric layer 66 on the base substrate 50. Specifically, an orthographic projection of the active layer 52 of the thin film transistor on the base substrate 50 does not fall within the orthographic projection of the first interlayer dielectric layer 66 on the base substrate 50, and the orthographic projection of the light shielding layer 62 on the base substrate 50 does not fall within the orthographic projection of the first interlayer dielectric layer 66 on the base substrate 50, that is, structures including the thin film transistor and the light shielding layer are all located in the opening 662 formed in the first interlayer dielectric layer 66, in this way, an overall thickness of the array substrate 100 may not be increased.

For example, the second buffer layer 63 is provided between the light shielding layer 62 and the active layer 52. The second buffer layer 63 covers the gate line GL, the light shielding layer 62 and the power supply line ELVDD, that is, an orthographic projection of each of the gate line GL, the light shielding layer 62 and the power supply line ELVDD on the base substrate 50 falls within an orthographic projection of the second buffer layer 63 on the base substrate 50.

For example, the thickness of the first buffer layer 61 may be greater than the thickness of the gate line GL, a via hole exposing the gate line GL is formed in the first buffer layer 61, and a conductive material is deposited in the via hole to form a first conductive plug 613. For example, the material of the first conductive plug 613 may be the same as the material of the light shielding layer 62, so the first conductive plug 613 may be located in the same layer as the light shielding layer 62. A via hole exposing the first conductive plug 613 is formed in both the second buffer layer 63 and the second interlayer dielectric layer 56, and a conductive material is deposited in the via hole to form a second conductive plug 615. For example, the material of the second conductive plug 615 may be the same as the material of the source electrode 50S and the drain electrode 50D, so the second conductive plug 615 may be in the same layer as the source electrode 50S and the drain electrode 50D. The gate line GL may be electrically connected to the gate electrode of the thin film transistor (for example, the switching transistor SW shown in FIG. 2) through the first conductive plug 613 and the second conductive plug 615.

Referring to FIG. 5, the first buffer layer 61 may include a recessed area 612 that is recessed toward the base substrate 50, and an orthographic projection of each of the thin film transistor and the light shielding layer 62 on the first buffer layer 61 falls within the recess area 612.

For example, a via hole exposing the power supply line ELVDD is formed in both the second buffer layer 63 and the second interlayer dielectric layer 56, and a conductive material is deposited in the via hole to form a third conductive plug 617. For example, the material of the third conductive plug 617 may be the same as the material of the source electrode 50S and the drain electrode 50D, so the third conductive plug 617 may be located in the same layer as the source electrode 50S and the drain electrode 50D. The power supply line ELVDD may be electrically connected to the source electrode of the thin film transistor (for example, the driving transistor DR shown in FIG. 2) through the third conductive plug 617.

For example, a via hole exposing the light shielding layer 62 is formed in both the second buffer layer 63 and the second interlayer dielectric layer 56, and a conductive material is deposited in the via hole to form a fourth conductive plug 619. For example, the material of the fourth conductive plug 619 may be the same as the material of the source electrode 50S and the drain electrode 50D, so the fourth conductive plug 619 may be located in the same layer as the source electrode 50S and the drain electrode 50D. The light shielding layer 62 may be electrically connected to the power supply line ELVDD or the source electrode 10S through the fourth conductive plug 619. Since the light shielding layer 62 is usually made of a metal material, charges are easily accumulated on the metal light shielding layer 62. As a result, the metal light shielding layer 62 with accumulated charges will affect a performance of the pixel driving circuit (for example, a switching performance of the transistor or a capacity of the capacitor, etc.), for example, a floating potential of the metal light shielding layer 62 with accumulated charges will affect an output characteristic of the driving thin film transistor of the pixel, for example, the output characteristic curve is kinked, that is, the Kink effect is presented. In this embodiment, by electrically connecting the light shielding layer 62 to the power supply line ELVDD or the source electrode 50S, the above-mentioned adverse effects may be avoided.

For example, the material of each signal line (such as each of the gate line GL and the power supply line ELVDD) may be a copper-based metal, for example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb), etc. As another example, each signal line may be formed by using a thick copper process, that is, the signal line is formed of a copper material with a large thickness. For example, the thickness of the signal line formed by the thick copper process may be at least 1.5 times of the thickness of the signal line formed by the conventional process. Alternatively, the thickness of the signal line formed by the thick copper process is more than 7000 Å, that is, In this embodiment, the signal line 60 may be a copper wire with a thickness of 7000 Å or more to reduce the resistance of the signal line, thereby reducing the influence of IR Drop and improving the performance of the display device. Therefore, the array substrate according to some embodiments of the present disclosure may be applied to a high PPI display device.

Referring to FIG. 5, the thin film transistor and the light shielding layer are located in the opening 662 formed in the first interlayer dielectric layer 66. The first buffer layer 61 covers the gate line GL, the second buffer layer 63 covers the power supply line ELVDD, and the active layer 52 is disposed on a side of the second buffer layer 63 facing away from the base substrate 50. That is, the gate line GL may be located on a different layer from the gate electrode 10G, and the power supply line ELVDD may be located on a different layer from the source electrode 10S and the drain electrode 10D. Since each signal line is located on the side of the thin film transistor facing the base substrate, specifically, the gate line GL and the gate electrode 10G are located on different layers, and the power supply line ELVDD is located on a different layer from the source electrode 10S and the drain electrode 10D, so that the thickness of each signal line may be increased without increasing the thicknesses of the source electrode, gate electrode and drain electrode of the thin film transistor, that is, the thickness of the first signal line such as the gate line GL may be greater than the thickness of the gate electrode of the thin film transistor, and the thickness of the second signal line such as the power supply line ELVDD may be greater than the thickness of the source electrode or drain electrode of the thin film transistor. Moreover, the increase in the thickness of each signal line does not cause a height of the entire structure of the thin film transistor (dimension H2 in FIG. 5) to increase. In this way, a height difference at the source electrode and the drain electrode of the thin film transistor is small. In the case of the small height difference, it is not necessary to set the thickness of the second interlayer dielectric layer 56 to be large, without forming a short circuit between the gate electrode and the source electrode or drain electrode of the thin film transistor.

For example, the thickness of the first signal line such as the gate line GL is at least 1.5 times of the thickness of the gate electrode of the thin film transistor, and the thickness of the second signal line such as the power supply line ELVDD is at least 1.5 times of the thickness of the source electrode or the drain electrode of the thin film transistor. For another example, the thickness of each of the first signal line and the second signal line may be about 7000 Å, a thickness of a metal layer where the gate electrode of the thin film transistor is located may be about 4200 Å, and a thickness of a metal layer where the source electrode and the drain electrode of the thin film transistor are located may be about 4200 Å.

Moreover, since each signal line is located on the side of the thin film transistor facing the base substrate, specifically, the gate line GL and the gate electrode 10G are located on different layers, and the power supply line ELVDD is located on a different layer from the source electrode 10S and the drain electrode 10D, so the thicknesses of the second interlayer dielectric layer 56 and the second insulating layer 58 are not necessary to be set large, thereby reducing a difficulty of dry etching processes in processes of forming patterns of the second interlayer dielectric layer 56 and the second insulating layer 58 and forming via holes in the second interlayer dielectric layer 56 and the second insulating layer 58.

Further, referring to FIG. 2, FIG. 3 and FIG. 5 together, the capacitor Cst shown in FIG. 2 is usually formed between two conductive layers, that is, one conductive layer serves as the first electrode plate of the capacitor Cst, and the other conductive layer serves as the second electrode plate of the capacitor Cst, and an insulating layer is interposed between the two electrode plates to form the capacitor Cst. For example, the conductive light shielding layer 62 may be electrically connected to the power supply line ELVDD, so as to serve as the first electrode plate of the capacitor Cst, and the gate electrode 50G of the driving transistor DR may serve as the second electrode plate of the capacitor Cst. An orthographic projection of the light shielding layer 62 on the base substrate 50 overlaps with an orthographic projection of the gate electrode 50G of the driving transistor DR on the base substrate 50, and a plurality of insulating layers are interposed between the light shielding layer 62 and the gate electrode 50G of the driving transistor DR, to form the capacitor Cst. Since the thickness of the second buffer layer 66 interposed between the light shielding layer 62 and the first electrode 59 is small, a distance between the two electrode plates of the capacitor Cst is small. As a result, the capacitor Cst may have a large capacitance value, thereby facilitating to improving the performance of the display panel.

With reference to FIGS. 2, 3 and 5, the thin film transistors provided on the array substrate may include the switching transistor SW and the driving transistor DR. As shown in FIG. 5, the gate line GL is led out through the first conductive plug 613 and the second conductive plug 615. With reference to FIGS. 2 and 3 again, the second conductive plug 615 may be electrically connected to the gate electrode G of the switching transistor SW. In this way, the gate line GL is electrically connected to the gate electrode G of the switching transistor SW through the first conductive plug 613 and the second conductive plug 615. Also, one of the source electrode and the drain electrode of the switching transistor SW (for example, the source electrode S) is electrically connected to the data line DL, and the other one of the source electrode and the drain electrode of the switching transistor SW (for example, the drain electrode D) is electrically connected to the gate electrode 50G of the driving transistor DR. One of the source electrode and the drain electrode of the driving transistor DR (for example, the source electrode S) is electrically connected to the power supply line ELVDD.

Figure 6:
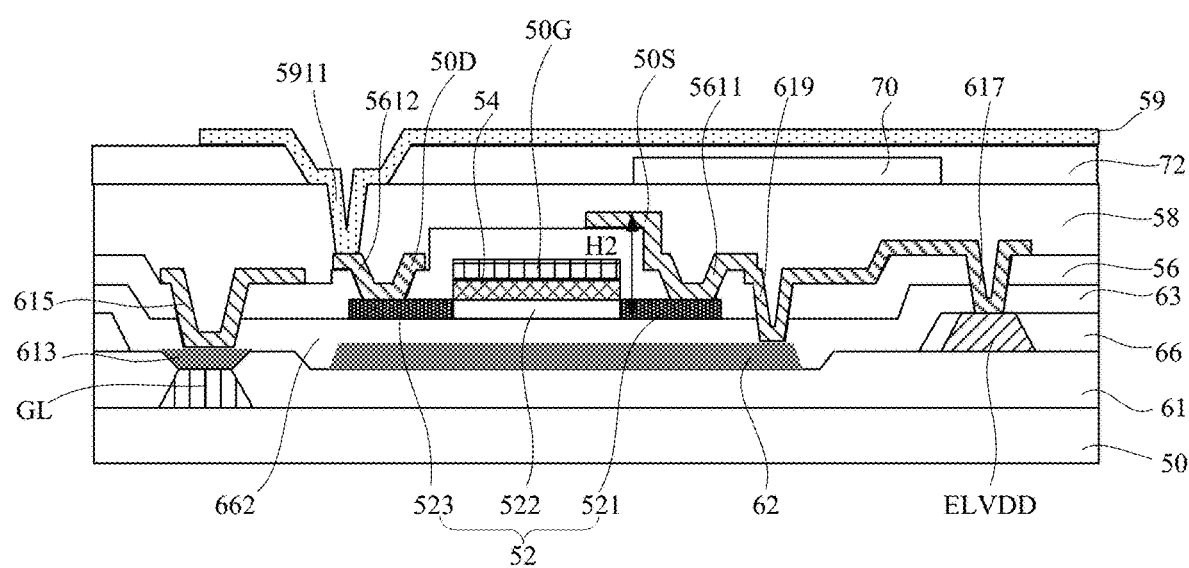
FIG. 6 is a cross-sectional view, taken along line I-I' in FIG. 3, of one sub-pixel of the array substrate having a COA structure according to some exemplary embodiments of the present disclosure.

For example, the array substrate according to the embodiments of the present disclosure may further have a COA (color filter on array) structure. Referring to FIG. 6, the array substrate may include: a color filter layer 70 disposed on a side of the second insulating layer 58 facing away from the base substrate 50; and a third insulating layer 72 disposed on a side of the second insulating layer 58 facing away from the base substrate 50 and covering the color film layer 70. The first electrode 59 may be disposed on a side of the third insulating layer 72 facing away from the base substrate 50, and the first electrode 59 is electrically connected to the drain electrode through the seventh conductive plug 5911 formed in both the second insulating layer 58 and the third insulating layer 72.

It should be understood that, for other structures of the array substrate shown in FIG. 6 (such as signal lines, light shielding layer, thin film transistor, etc.), reference may be made to the structure of the array substrate shown in FIG. 5, and descriptions are not repeated here.

Figure 7:
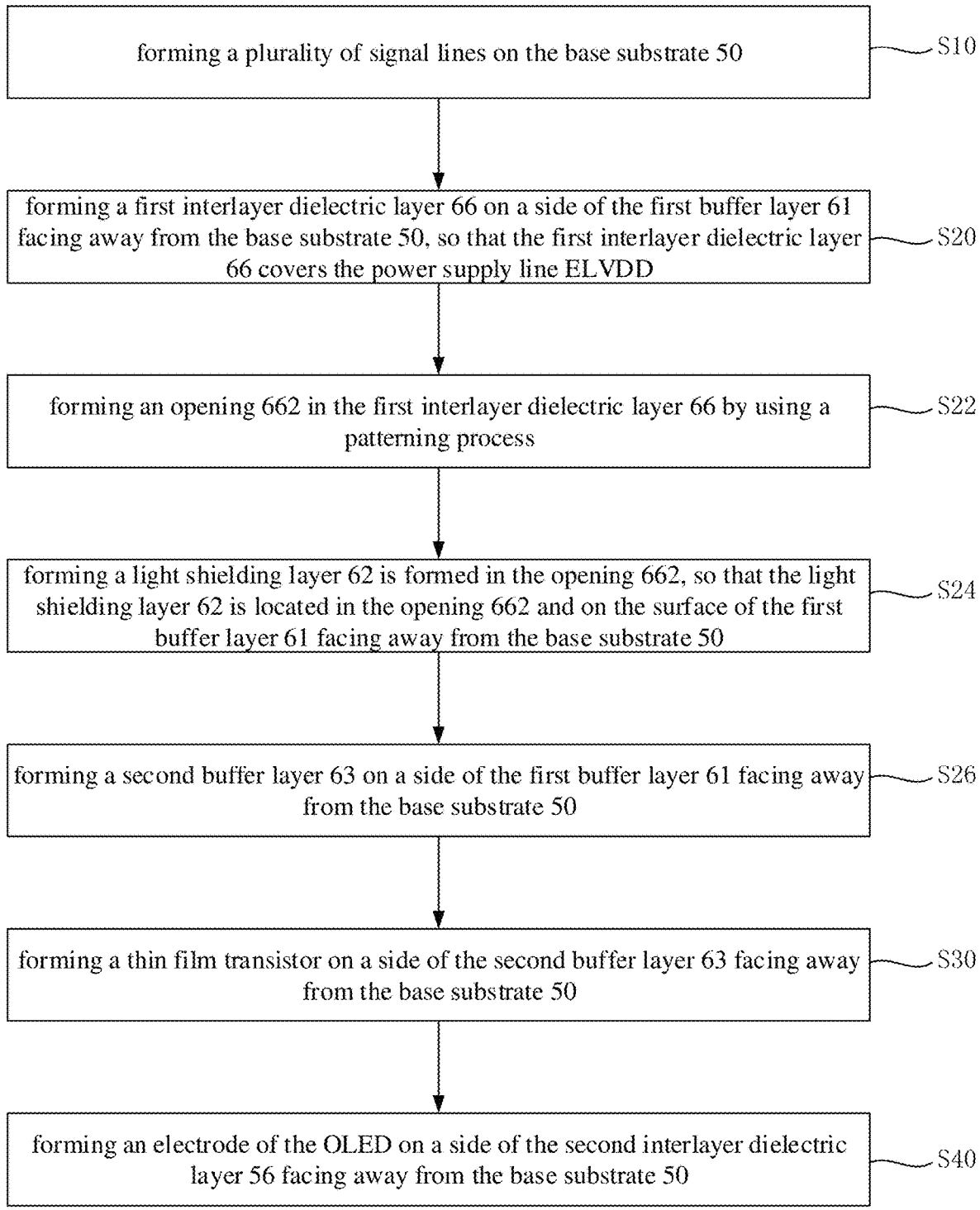
FIG. 7 is a flowchart of a method of manufacturing an array substrate according to some exemplary embodiments of the present disclosure.

FIG. 7 is a flowchart of a method of manufacturing an array substrate according to some exemplary embodiments of the present disclosure. Referring to FIG. 7, the method of manufacturing the array substrate may be performed according to the following steps. It should be noted that, according to some embodiments of the present disclosure, the following steps may be performed individually or in combination, and may be performed in parallel or sequentially, and are not limited to the specific operation sequence described below.

In step S10, a plurality of signal lines are formed on the base substrate 50, for example, the gate line GL and the power supply line ELVDD may be formed on the base substrate 50. Specifically, step S10 may be performed according to the following steps.

Figure 8A:
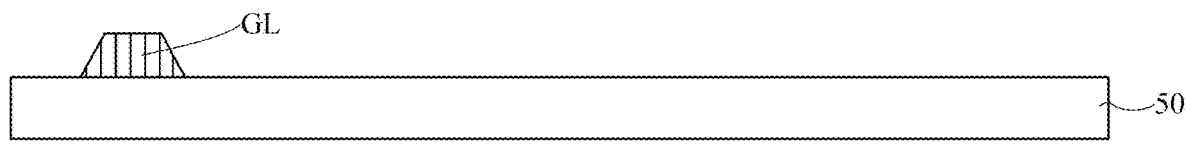
FIGS. 8A-8C are cross-sectional views formed after each sub-step of forming a plurality of signal lines in the method of manufacturing the array substrate according to some embodiments of the present disclosure is performed.

In step S101, referring to FIG. 8A, the gate line GL is formed on the base substrate 50. For example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb) and other copper-based metals may be used to form the gate line GL. For another example, a thick copper process may be used to form the gate line GL so that the thickness of the formed gate line GL is 7000 Å or more, so as to reduce the resistance of the signal line.

Figure 8B:
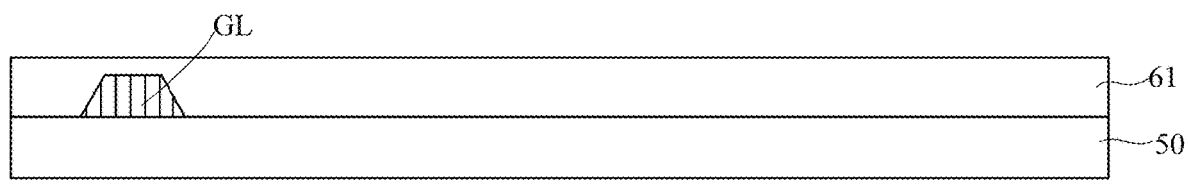

In step S102, referring to FIG. 8B, a first buffer layer 61 is formed on the base substrate 50 so that the first buffer layer 61 covers the gate line GL. For example, the first buffer layer 61 may be formed of an insulating material such as silicon nitride ($SiN_x$), silicon oxide ($SiO_x$), or the like.

Figure 8C:
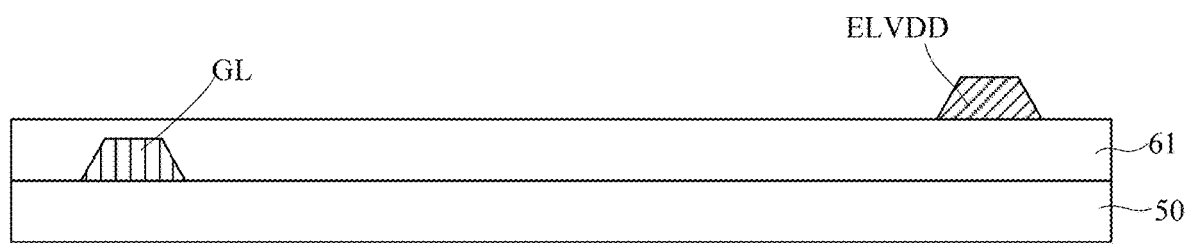

In step S103, referring to FIG. 8C, the power supply line ELVDD is formed on the base substrate 50. For example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper molybdenum niobium alloy (Cu/Mo/Nb) and other copper-based metals may be used to form the power supply line ELVDD. For another example, a thick copper process may be used to form the power supply line ELVDD so that the thickness of the formed power supply line ELVDD is 7000 Å or more, so as to reduce the resistance of the signal line.

Figure 9A:
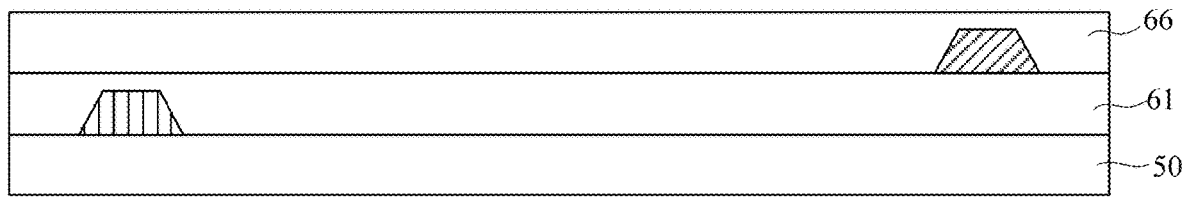
FIG. 9A is a cross-sectional view formed after a step of forming a first interlayer dielectric layer in the method of manufacturing the array substrate according to some embodiments of the present disclosure is performed.

In step S20, referring to FIG. 9A, a first interlayer dielectric layer 66 is formed on a side of the first buffer layer 61 facing away from the base substrate 50, so that the first interlayer dielectric layer 66 covers the power supply line ELVDD. For example, an insulating material such as silicon nitride ($SiN_x$), silicon oxide ($SiO_x$), or the like may be used to form the first interlayer dielectric layer 66.

Figure 9B:
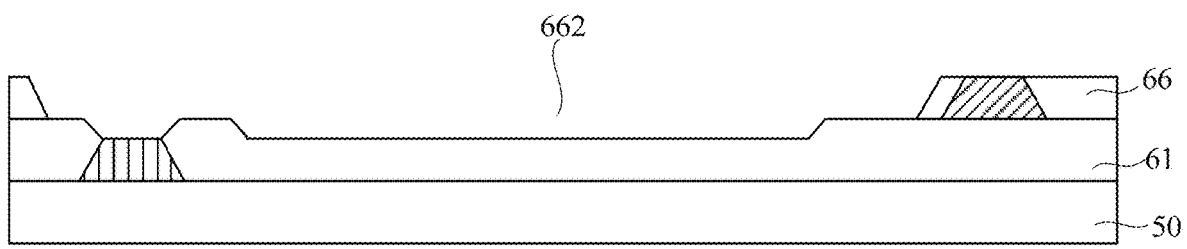
FIG. 9B is a cross-sectional view formed after a step of forming an opening in the method of manufacturing the array substrate according to some embodiments of the present disclosure is performed.

In step S22, referring to FIG. 9B, an opening 662 is formed in the first interlayer dielectric layer 66 by using a patterning process. For example, the opening 662 may be formed by using a mask and a dry etching process. The opening 662 is used to accommodate the light shielding layer and the thin film transistor to be formed. Specifically, the opening 662 exposes the gate line GL and the first buffer layer 61. Optionally, the opening 662 is also formed in a part of the first buffer layer 61.

Optionally, referring further to FIG. 9B, after the patterning process is performed on the first interlayer dielectric layer 66, an upper surface of the power supply line ELVDD is also exposed.

Figure 9C:
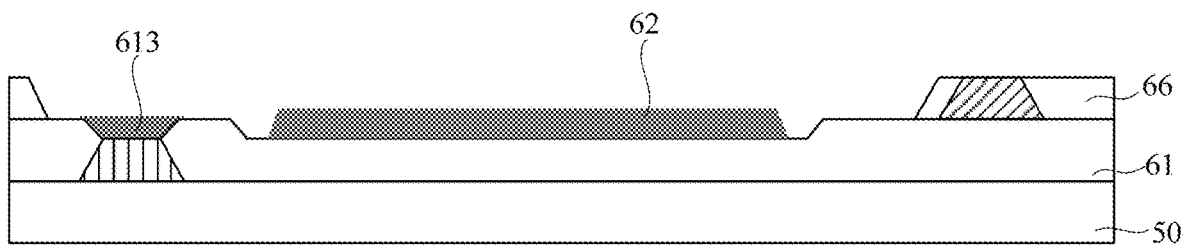
FIG. 9C is a cross-sectional view formed after a step of forming a light shielding layer in the method of manufacturing the array substrate according to some embodiments of the present disclosure is performed.

In step S24, referring to FIG. 9C, a light shielding layer 62 is formed in the opening 662. For example, a metal material may be used to form the light shielding layer 62 so that the light shielding layer 62 is located in the opening 662 and on the surface of the first buffer layer 61 facing away from the base substrate 50.

Alternatively, in step S24, while forming the light shielding layer 62, the first conductive plug 613 may be formed in the opening 662 and on the surface of the gate line GL facing away from the base substrate 50.

Figure 9D:
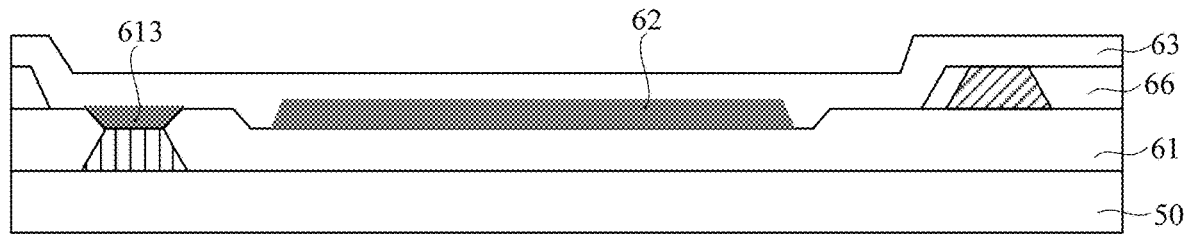
FIG. 9D is a cross-sectional view formed after a step of forming a second buffer layer in the method of manufacturing the array substrate according to some embodiments of the present disclosure is performed.

In step S26, referring to FIG. 9D, a second buffer layer 63 is formed on a side of the first buffer layer 61 facing away from the base substrate 50. For example, an insulating material such as silicon nitride ($SiN_x$), silicon oxide ($SiO_x$) or the like may be used to form the second buffer layer 63. A part of the second buffer layer 63 is formed in the opening 662. The second buffer layer 63 covers the gate line GL, the light shielding layer 62 and the power supply line ELVDD, that is, an orthographic projection of each of the gate line GL, the light shielding layer 62 and the power supply line ELVDD on the base substrate 50 falls within an orthographic projection of the second buffer layer 63 on the base substrate 50.

In step S30, a thin film transistor is formed on a side of the second buffer layer 63 facing away from the base substrate 50. Specifically, step S30 may be performed according to the following steps.

Figure 10A:
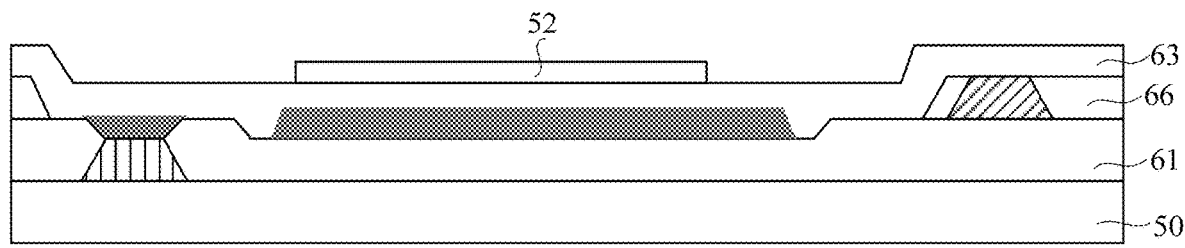
FIGS. 10A-10F are cross-sectional views formed after each sub-step of forming a thin film transistor in the method of manufacturing the array substrate according to some embodiments of the present disclosure is performed.

In step S301, referring to FIG. 10A, an active layer 52 of the thin film transistor is formed on the side of the second buffer layer 62 facing away from the base substrate 50. For example, the active layer 52 may be formed of a semiconductor material, which may include, for example, amorphous silicon, polycrystalline silicon, oxide semiconductor, etc. The oxide semiconductor material may include, for example, IGZO (indium gallium zinc oxide), ZnO (zinc oxide), etc.

Figure 10B:
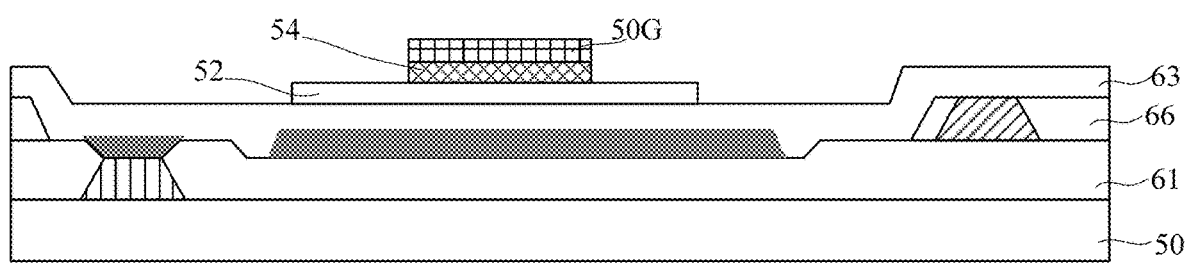

In step S302, referring to FIG. 10B, a gate insulating layer 54 and a gate electrode 50G of the thin film transistor are formed on the side of the active layer 52 facing away from the base substrate 50 in that order. For example, an insulating material such as silicon nitride ($SiN_x$), silicon oxide ($SiO_x$), aluminum oxide ($Al_2O_3$), or aluminum nitride (AlN) may be used to form the gate insulating layer 54. The gate electrode 50G may be formed of a metal material such as copper (Cu), molybdenum (Mo), or copper-molybdenum alloy (Cu/Mo).

Specifically, a gate insulating material layer and a gate material layer may be sequentially formed on the side of the active layer 52 facing away from the base substrate 50; then, a patterning process is performed on the gate material layer by using a mask patterning and a wet etching process so as to form the gate electrode 50G; then, a dry etching process is used to etch the gate insulating material layer to form the gate insulating layer 54.

Figure 10C:
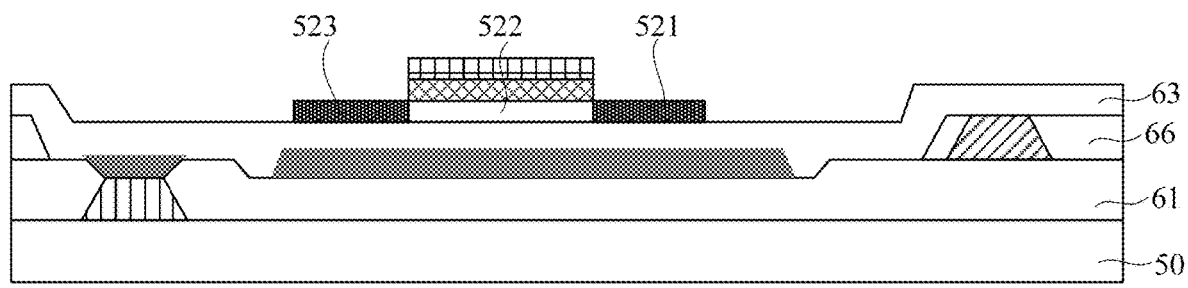

In step S303, referring to FIG. 10C, a conductive process is performed on the active layer 52 so that the active layer 52 includes a channel region 522 and a source electrode 521 and a drain region 523 located on both sides of the channel region 522. For example, the conductive treatment process may include a plasma conductive treatment process.

Figure 10D:
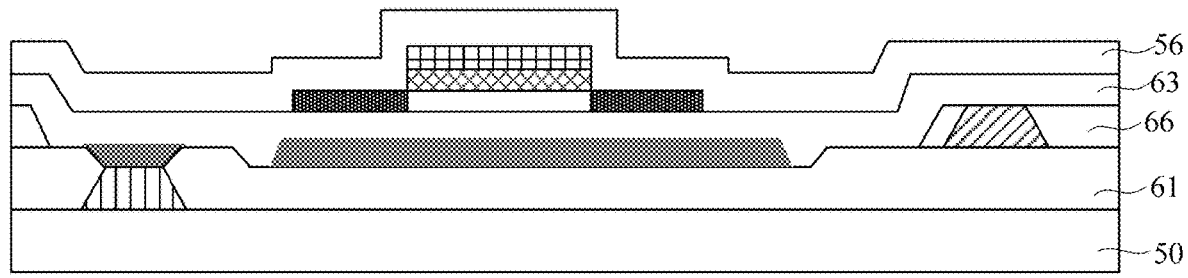

In step S304, referring to FIG. 10D, a second interlayer dielectric layer 56 is formed on the side of the gate electrode 50G facing away from the base substrate 50. For example, an insulating material such as silicon nitride ($SiN_x$), silicon oxide ($SiO_x$) or the like may be used to form the second interlayer dielectric layer 56.

Figure 10E:
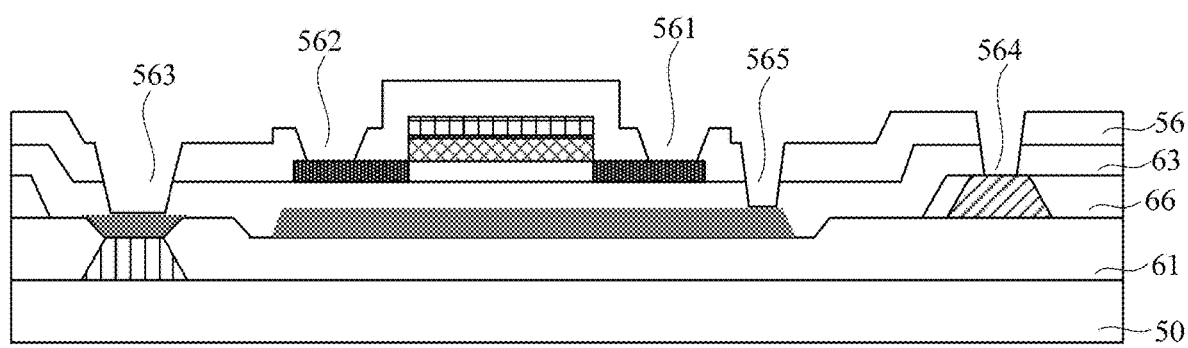

In step S305, referring to FIG. 10E, a first via hole 561 exposing the source region 521 and a second via hole 562 exposing the drain region 523 are respectively formed in the second interlayer dielectric layer 56; and a third via hole 563 exposing the first conductive plug 613, a fourth via hole 564 exposing the power supply line ELVDD, and a fifth via hole 565 exposing the light shielding layer 62 are respectively formed in both the second interlayer dielectric layer 56 and the second buffer layer 63. For example, the above-mentioned via holes may be formed by mask patterning and dry etching processes.

Figure 10F:
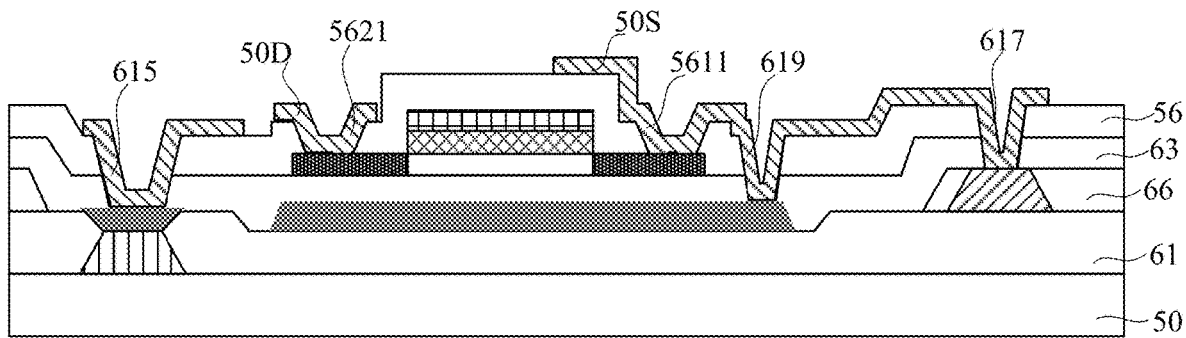

In step S306, referring to FIG. 10F, the source electrode 50S and the drain electrode 50D of the thin film transistor are formed on a side of the second interlayer dielectric layer 56 facing away from the base substrate 50.

For example, a conductive metal material such as copper (Cu), molybdenum (Mo), or copper-molybdenum alloy (Cu/Mo) may be deposited on the side of the second interlayer dielectric layer 56 facing away from the base substrate 50, at the same time, the conductive metal material is deposited in the first via hole 561 to form a fifth conductive plug 5611, deposited in the second via hole 562 to form a sixth conductive plug 5621, deposited in the third via hole 563 to form a second conductive plug 615, deposited in the fourth via hole 564 to form the third conductive plug 617, and deposited in the fifth via hole 565 to form the fourth conductive plug 619. Then, one patterning process is performed on the deposited conductive metal material layer to form the source electrode 50S, the drain electrode 50D, and conductive structures electrically connected to the gate line GL, the power supply line ELVDD, and the light shielding layer 62, respectively.

In step S40, an electrode of the OLED is formed on a side of the second interlayer dielectric layer 56 facing away from the base substrate 50. Specifically, the step S40 may be performed according to the following steps.

Figure 11A:
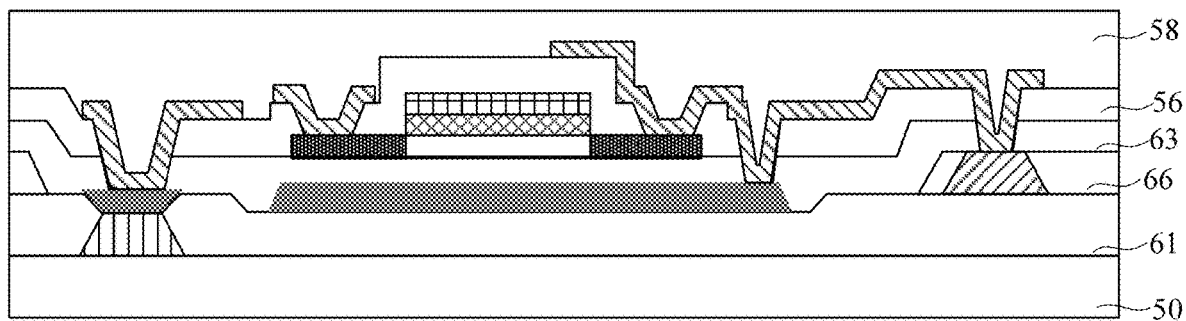
FIGS. 11A-11E are cross-sectional views formed after each sub-step of forming an electrode in the method of manufacturing the array substrate according to some embodiments of the present disclosure is performed.

In step S401, referring to FIG. 11A, a second insulating layer 58 is formed on the side of the second interlayer dielectric layer 56 facing away from the base substrate 50.

Figure 11B:
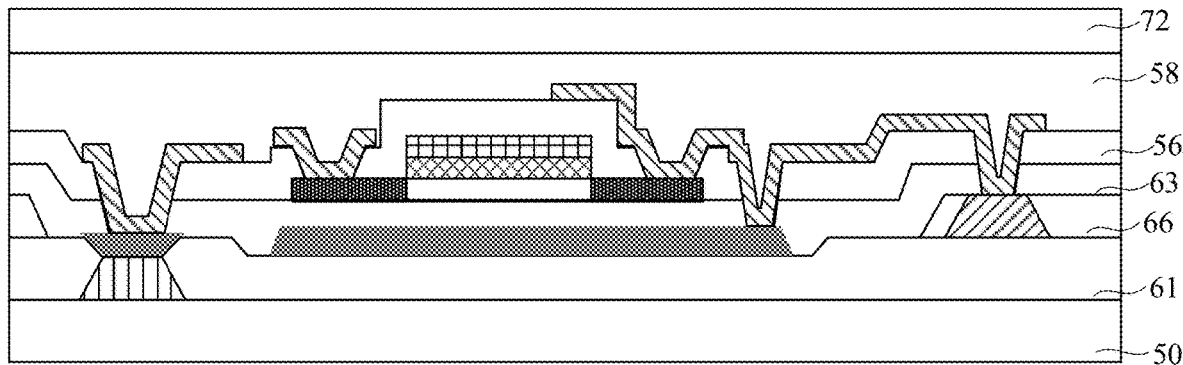

In step S402, referring to FIG. 11B, a third insulating layer 72 is formed on the side of the second insulating layer 58 facing away from the base substrate 50.

Figure 11C:
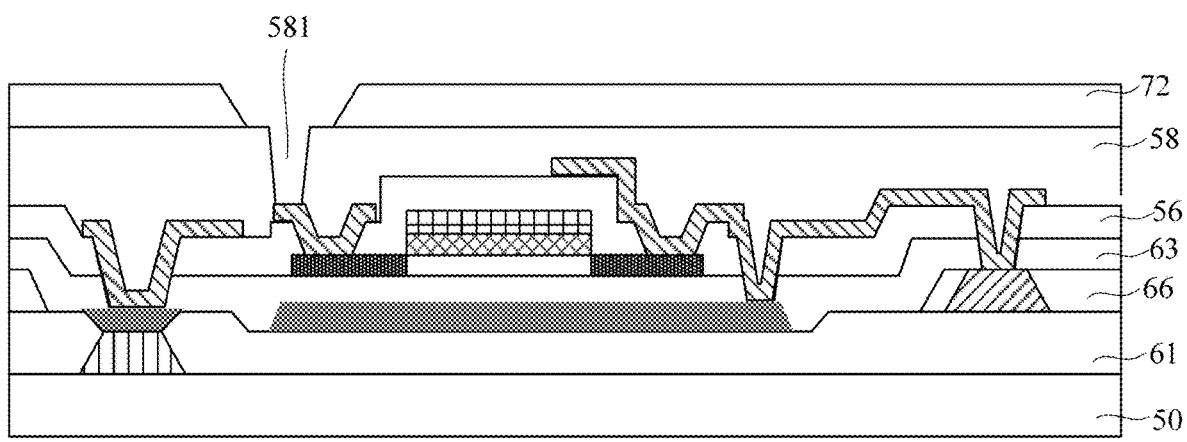

In step S403, referring to FIG. 11C, a via hole 581 is formed in both the second insulating layer 58 and the third insulating layer 72. For example, the via hole 581 may expose the drain electrode 50D.

Figure 11D:
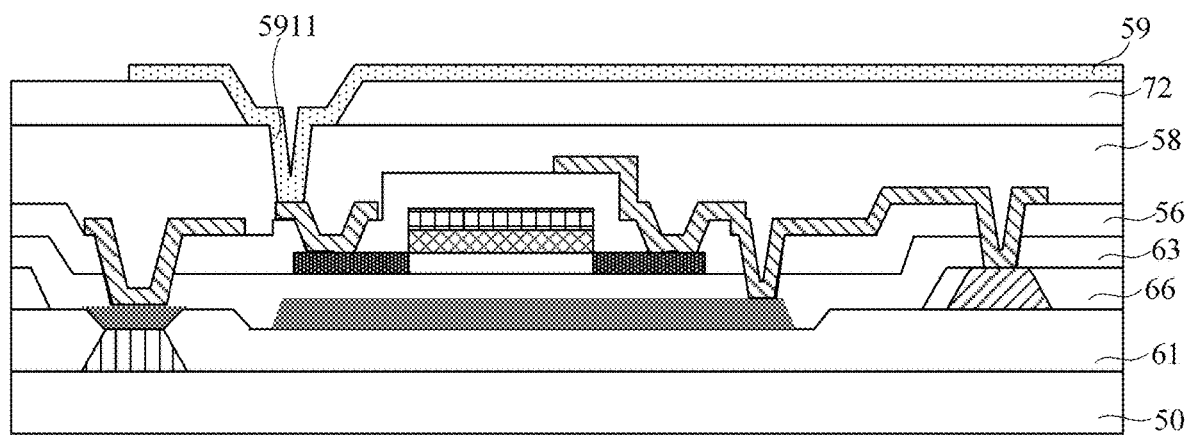

In step S404, referring to FIG. 11D, a first electrode 59 is formed on a side of the third insulating layer 72 facing away from the base substrate 50.

For example, a conductive material such as ITO may be deposited on the side of the third insulating layer 72 facing away from the base substrate 50, and at the same time, the conductive material is deposited in the via hole 581 to form a seventh conductive plug 5911. For example, the first electrode 59 may be the anode of the OLED. The first electrode 59 is electrically connected to the drain electrode 50D of the thin film transistor through the seventh conductive plug 5911.

Figure 11E:
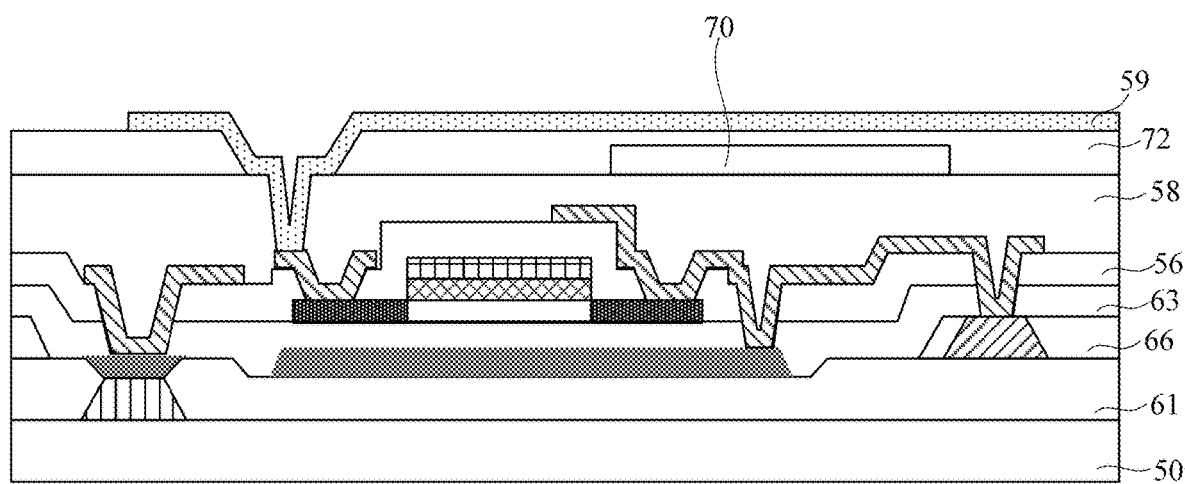

Optionally, the step S40 may also include a step S4015. The step S4015 may be performed between the step S401 and the step S402. In the step S4015, referring to FIG. 11E, a color filter layer 70 is formed on the side of the second insulating layer 58 facing away from the base substrate 50.

Those skilled in the art should understand that the method of manufacturing the array substrate according to the embodiments of the present disclosure should have the characteristics and advantages of the array substrate provided by the above-mentioned embodiments of the present disclosure, which will not be repeated here.

Figure 12:
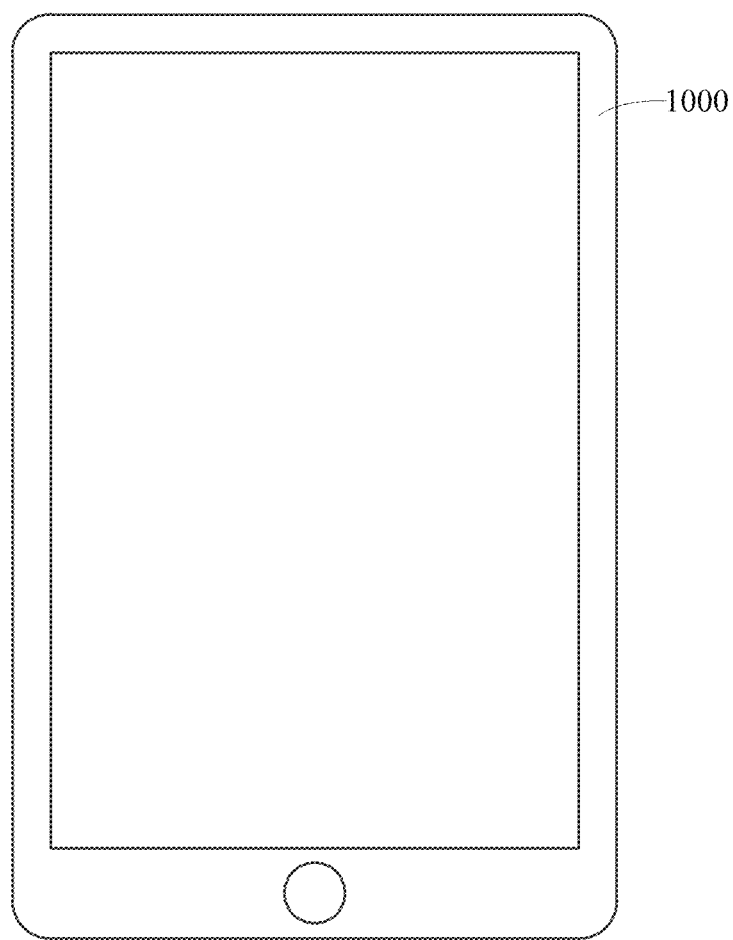
FIG. 12 is a schematic view of a display device according to some embodiments of the present disclosure.

In addition, the embodiments of the present disclosure also provide a display device including the array substrate provided by the above embodiments. As shown in FIG. 12, which shows a plan view of a display device according to some embodiments of the present disclosure, the display device 1000 may include the array substrate described in any one of the above embodiments, and in particular, it may be a high-PPI display device. For example, the display device may be any product with a display function such as a smart phone, a wearable smart watch, smart glasses, a tablet computer, a TV, a display, a notebook computer, a digital photo frame, a navigator, a car display, an e-book, or the like.

In summary, the present disclosure provides an array substrate and a method of manufacturing the same, and a display device including the array substrate, which is advantageous for forming a signal line with a large thickness, so as to at least reduce various adverse effects due to the IR Drop, thereby improving the performance of the display device.

Although some embodiments of the general concept of the present disclosure have been illustrated and described, those skilled in the art will understand that changes may be made to these embodiments without departing from the principle and spirit of the general inventive concept. The scope shall be defined by the claims and their equivalents.

What is claimed is:

1. An array substrate, comprising:
   a base substrate;
   a first signal line on the base substrate;
   a first buffer layer provided on the base substrate and covering the first signal line;
   a second signal line on a side of the first buffer layer facing away from the base substrate;
   a first insulating layer provided on the base substrate and covering the second signal line; and
   a thin film transistor on a side of the first insulating layer facing away from the base substrate, the thin film transistor comprising a gate electrode, a source electrode and a drain electrode,
   wherein a thickness of the first signal line is greater than a thickness of the gate electrode of the thin film transistor, and a thickness of the second signal line is greater than a thickness of the source electrode or the drain electrode of the thin film transistor.

2. The array substrate of claim 1, wherein the thickness of the first signal line is at least 1.5 times of the thickness of the gate electrode of the thin film transistor, and the thickness of the second signal line is at least 1.5 times of the thickness of the source electrode or the drain electrode of the thin film transistor.

3. The array substrate of claim 1, wherein the first signal line and the second signal line each comprise copper, copper-molybdenum alloy, copper-titanium alloy, copper-molybdenum-titanium alloy, copper-molybdenum-tungsten alloy, or copper-molybdenum-niobium alloy.

4. The array substrate of claim 1, wherein the first signal line comprises a gate line, and the second signal line comprises a power supply line or a data line.

5. The array substrate of claim 1, wherein the first insulating layer comprises a first interlayer dielectric layer and a second buffer layer, the first interlayer dielectric layer is disposed on both sides of the second signal line, and the second buffer layer is disposed on a side of the first interlayer dielectric layer facing away from the base substrate and covers the second signal line; and
   an orthographic projection of the thin film transistor on the base substrate does not overlap with an orthographic projection of the first interlayer dielectric layer on the base substrate.

6. The array substrate of claim 5, further comprising a light shielding layer between the first buffer layer and the second buffer layer,
   wherein the orthographic projection of the thin film transistor on the base substrate at least partially overlaps with an orthographic projection of the light shielding layer on the base substrate, and the orthographic projection of the light shielding layer on the base substrate does not overlap with the orthographic projection of the first interlayer dielectric layer on the base substrate.

7. The array substrate of claim 6, wherein the first buffer layer comprises a recessed area, the recessed area is recessed toward the base substrate, and an orthographic projection of each of the thin film transistor and the light shielding layer on the first buffer layer falls within the recessed area.

8. The array substrate of claim 6, wherein the array substrate further comprises:
   a second interlayer dielectric layer, the second interlayer dielectric layer being disposed on a side of the second buffer layer facing away from the base substrate;
   a first conductive plug which is disposed in a via hole penetrating the first buffer layer, located on a side of the first signal line away from the base substrate, and electrically connected to the first signal line; and
   a second conductive plug in a first via hole penetrating both the second buffer layer and the second interlayer dielectric layer, the second conductive plug electrically being connected to the first signal line through the first conductive plug.

9. The array substrate of claim 8, wherein the thin film transistor comprises a switching transistor, and the first signal line is electrically connected to a gate electrode of the switching transistor through both the first conductive plug and the second conductive plug.

10. The array substrate of claim 9, wherein the array substrate further comprises:
a third conductive plug in a second via hole penetrating through both the second buffer layer and the second interlayer dielectric layer, one of the source electrode and the drain electrode being electrically connected to the second signal line through the third conductive plug.

11. The array substrate of claim 10, wherein the thin film transistor further comprises a driving transistor; and
the second signal line comprises a data line and a power supply line, the data line is electrically connected to one of a source electrode and a drain electrode of the switching transistor, and the power supply line is electrically connected to one of a source electrode and a drain electrode of the driving transistor.

12. The array substrate of claim 11, wherein the other one of the source electrode and the drain electrode of the switching transistor is electrically connected to a gate electrode of the driving transistor.

13. The array substrate of claim 8, wherein the array substrate further comprises:
a fourth conductive plug in a second via hole penetrating both the second buffer layer and the second interlayer dielectric layer, the light shielding layer being electrically connected to the second signal line through the fourth conductive plug.

14. The array substrate of claim 13, wherein the first conductive plug is located in the same layer as the light shielding layer, and each of the second conductive plug, the third conductive plug, and the fourth conductive plug is located in the same layer as the source electrode or the drain electrode.

15. The array substrate of claim 10, further comprising:
a second insulating layer on a side of the second interlayer dielectric layer facing away from the base substrate;
a color film layer on a side of the second insulating layer facing away from the base substrate;
a third insulating layer provided on the side of the second insulating layer facing away from the base substrate and covering the color film layer; and
a first electrode on a side of the third insulating layer facing away from the base substrate, the first electrode being electrically connected to the other one of the source electrode and the drain electrode through a conductive plug in both the second insulating layer and the third insulating layer.

16. The array substrate of claim 1, wherein the thin film transistor is a top-gate thin film transistor.

17. A display device comprising the array substrate of claim 1.

18. A method of manufacturing an array substrate, comprising:
forming a first signal line on a base substrate;
forming a first buffer layer covering the first signal line on the base substrate;
forming a second signal line on a side of the first buffer layer facing away from the base substrate;
forming a first insulating layer covering the second signal line on the base substrate; and
forming a thin film transistor on a side of the first insulating layer facing away from the base substrate, the thin film transistor comprising a gate electrode, a source electrode and a drain electrode,
wherein a thickness of the first signal line is greater than a thickness of the gate electrode of the thin film transistor, and a thickness of the second signal line is greater than a thickness of the source electrode or the drain electrode of the thin film transistor.

19. The method of claim 18, further comprising:
forming an opening in the first interlayer dielectric layer; and
through one patterning process, forming a light shielding layer on a side of the first buffer layer facing away from the base substrate and in the opening, and forming a first conductive part on a side of the first signal line facing away from the base substrate.

20. The method of claim 19, further comprising:
forming a second interlayer dielectric layer covering the thin film transistor on a side of the second buffer layer facing away from the base substrate;
through one patterning process, forming a first via hole and a second via hole, both of which penetrate the second interlayer dielectric layer, and forming a third via hole, a fourth via hole and a fifth via hole, each of which penetrates both the second buffer layer and the second interlayer dielectric layer; and
depositing a conductive metal material to form a second conductive part in the third via hole, a third conductive part in the fourth via hole, and a fourth conductive part in the fifth via hole, so that the second conductive part is electrically connected to the first signal line through the first conductive part, one of the source electrode and the drain electrode is electrically connected to the second signal line through the third conductive part, and the light shielding layer is electrically connected to the second signal line through the fourth conductive part.

* * * * *